(12) United States Patent
Liu et al.

(10) Patent No.: US 11,197,378 B2
(45) Date of Patent: Dec. 7, 2021

(54) DEVICE FOR ASSEMBLING SCREWS INTO PRINTED CIRCUIT BOARD

(71) Applicants: HONG FU JIN PRECISION INDUSTRY (TAIYUAN) CO., LTD., Taiyuan (CN); HON HAI PRECISION INDUSTRY CO., LTD., New Taipei (TW)

(72) Inventors: Gang-Qiang Liu, Taiyuan (CN); Ming-Hui Hu, Taiyuan (CN); Yi Zhang, Taiyuan (CN)

(73) Assignees: HONG FU JIN PRECISION INDUSTRY (TAIYUAN) CO., LTD., Taiyuan (CN); HON HAI PRECISION INDUSTRY CO., LTD., New Taipei (TW)

(*) Notice: Subject to any disclaimer, the term of this patent is extended or adjusted under 35 U.S.C. 154(b) by 155 days.

(21) Appl. No.: 16/558,573

(22) Filed: Sep. 3, 2019

(65) Prior Publication Data

US 2021/0014973 A1    Jan. 14, 2021

(30) Foreign Application Priority Data

Jul. 10, 2019    (CN) .......................... 201910621707.7

(51) Int. Cl.
   *B23P 19/00*    (2006.01)
   *H05K 3/00*    (2006.01)

(52) U.S. Cl.
   CPC ... *H05K 3/0008* (2013.01); *H05K 2203/0195* (2013.01); *H05K 2203/167* (2013.01)

(58) Field of Classification Search
   CPC .......... H05K 13/0053; H05K 13/0069; H05K 2203/0195; H05K 2203/167; H05K 3/0008
   See application file for complete search history.

(56) References Cited

U.S. PATENT DOCUMENTS

| | | | | |
|---|---|---|---|---|
| 5,042,146 A | * | 8/1991 | Watson | H05K 3/222 29/845 |
| 5,745,987 A | * | 5/1998 | Bartley | H05K 3/341 29/840 |
| 2009/0290342 A1 | * | 11/2009 | Zhang | F21V 17/12 362/235 |
| 2014/0198471 A1 | * | 7/2014 | Kajio | H05K 1/142 361/804 |
| 2016/0199151 A1 | * | 7/2016 | Lantz | A61C 1/084 433/75 |
| 2019/0283111 A1 | * | 9/2019 | Kawai | B21J 15/105 |
| 2020/0185860 A1 | * | 6/2020 | Zeng | H01R 12/62 |

* cited by examiner

*Primary Examiner* — Paul D Kim
(74) *Attorney, Agent, or Firm* — ScienBiziP, P.C.

(57) ABSTRACT

An assembly device for assembling a screw into a locking hole of a circuit board includes an assembled board and a guiding sleeve. The assembled board is configured to press against a circuit board. The guiding sleeve is movably arranged in the assembled board. A vertical channel is formed in an interior of the guiding sleeve. When the assembled board presses against the circuit board, one end of the guiding sleeve abuts against the circuit board, and the vertical channel is opposite to the screw hole on the circuit board. The screw is accurately assembled into the screw hole of the circuit board, thereby improving assembly efficiency.

19 Claims, 5 Drawing Sheets

DEVICE FOR ASSEMBLING SCREWS INTO PRINTED CIRCUIT BOARD

FIELD

The subject matter herein generally relates to manufacture of printed circuit boards.

BACKGROUND

A number of electronic components are placed on the board. These electronic components are usually fixed by operators securing the screws directly from the front of the board to the base. When locking the screws, it may be difficult for the operator to accurately lock the screws into the lock holes every time.

Therefore, there is a room for improvement.

BRIEF DESCRIPTION OF THE DRAWINGS

Implementations of the present disclosure will now be described, by way of embodiments, with reference to the attached figures.

DETAILED DESCRIPTION

Figure 1:
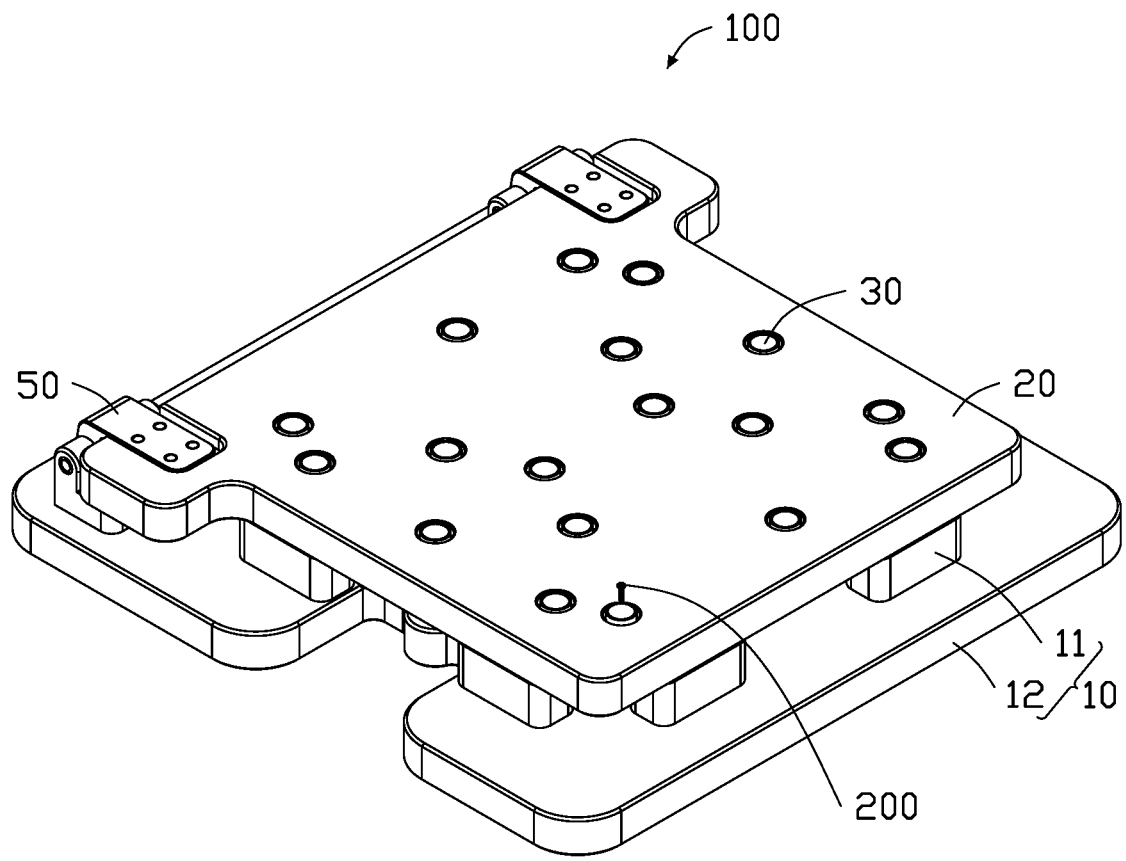
FIG. 1 is a schematic diagram of an embodiment of an assembly device.

It will be appreciated that for simplicity and clarity of illustration, where appropriate, reference numerals have been repeated among the different figures to indicate corresponding or analogous elements. Additionally, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising" means "including, but not necessarily limited to"; it specifically indicates open-ended inclusion or membership in a so-described combination, group, series, and the like.

Figure 2:
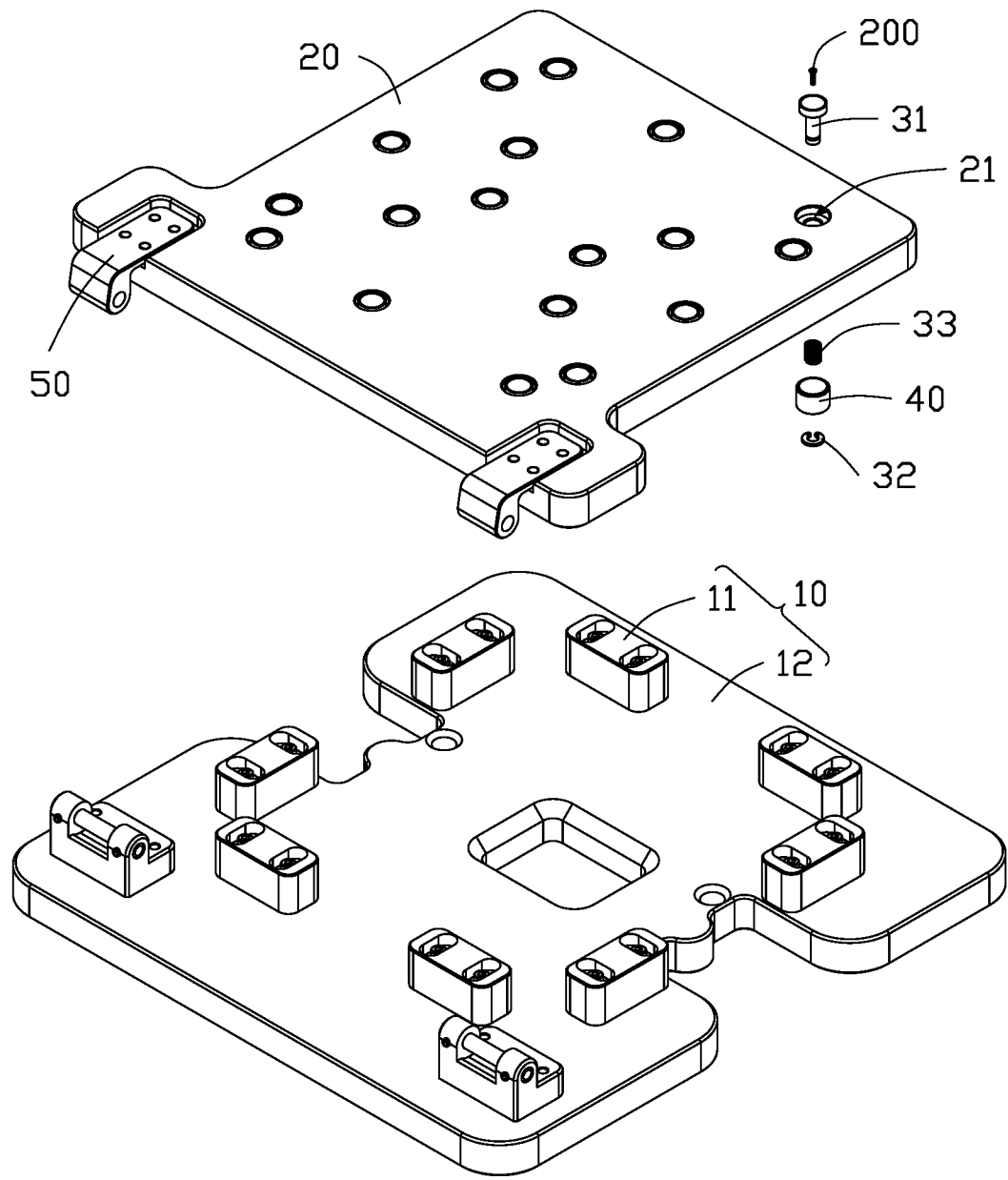
FIG. 2 is an exploded view of an embodiment of the device of FIG. 1.

FIGS. 1 and 2 illustrate an assembly device 100 in accordance with an embodiment of the present disclosure.

Figure 5:
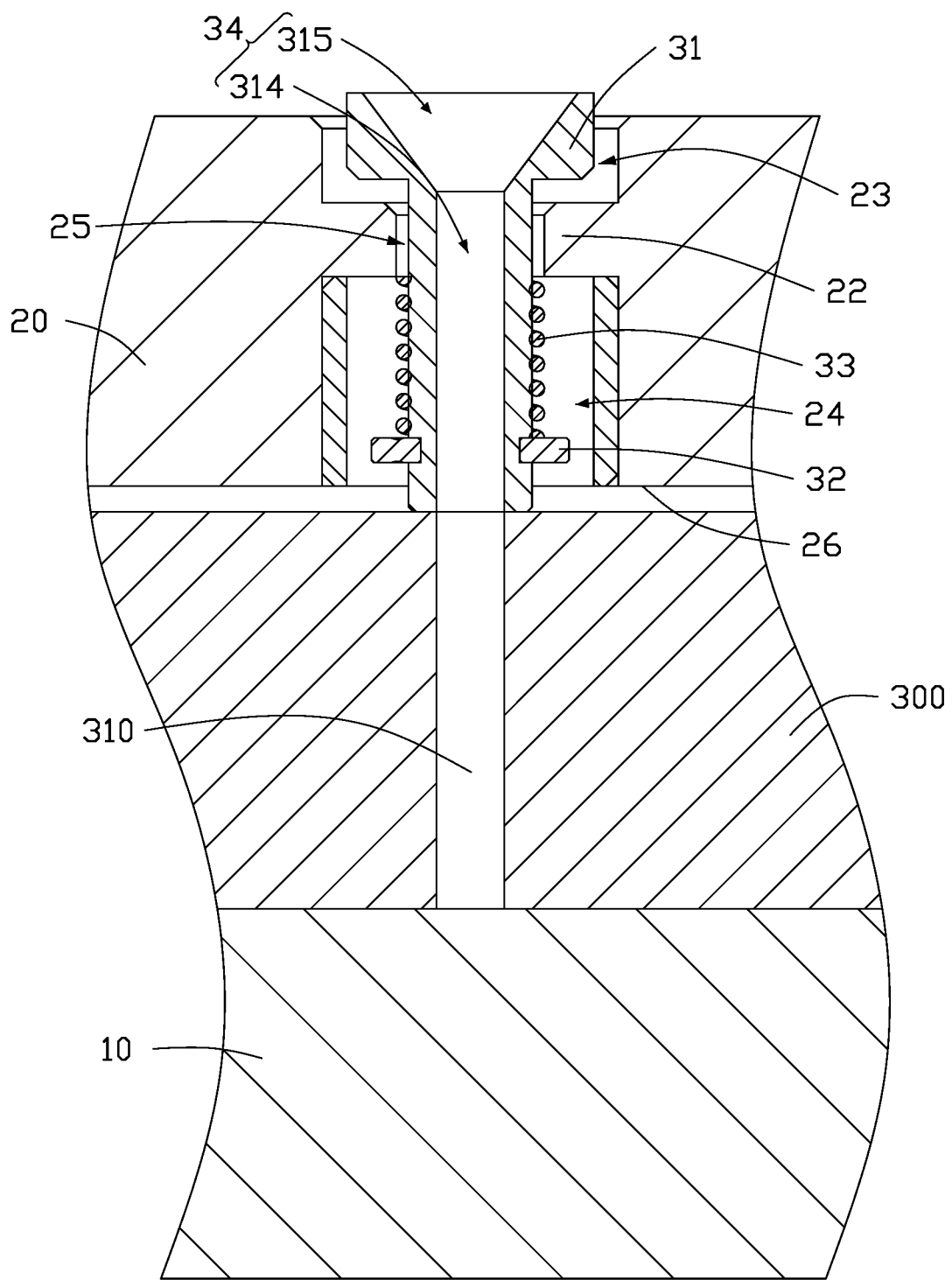
FIG. 5 is a sectional view of an embodiment of a circuit board and the guiding assembly.

The assembly device 100 is configured to assist an operator (not shown) or in combination with a lock screw tool (not shown) to install a screw 200 on a circuit board 300 (shown in FIG. 5).

In at least one embodiment, the assembly device 100 includes a fixture board 10, an assembly board 20, and a plurality of guiding modules 30.

The fixture board 10 receives the circuit board 300, the assembly board 20 is configured to press the fixture board 10 against the circuit board 300 under the operation of the operator or a machine.

In at least one embodiment, the assembly board 20 is rotatably coupled to one side of the fixture board 10, and the assembly board 20 can be rotated directly above the fixture board 10, thereby pressing the fixture board 10.

The assembly board 20 is not limited to being rotatably coupled to the fixture board 10, and the assembly board 20 may be detachably disposed from the fixture board 10. The assembly board 20 can be directly placed above the fixture board 10 and removed from the fixture board 10.

In at least one embodiment, the guiding modules 30 are movably disposed in the assembly board 20. The guiding modules 30 correspond to a plurality of locking holes 310 (shown in FIG. 5) on the circuit board 300.

Each guiding module 30 is configured to accurately introduce a screw 200 into the locking hole 310 of the circuit board 300.

The fixture board 10 includes a plurality of positioning members 11 and a main body 12. In at least one embodiment, the positioning members 11 are fixed on the main body 12. The positioning members 11 are configured to position the circuit board 300 on the main body 12 to avoid positional displacement of the circuit board 300.

Figure 3:
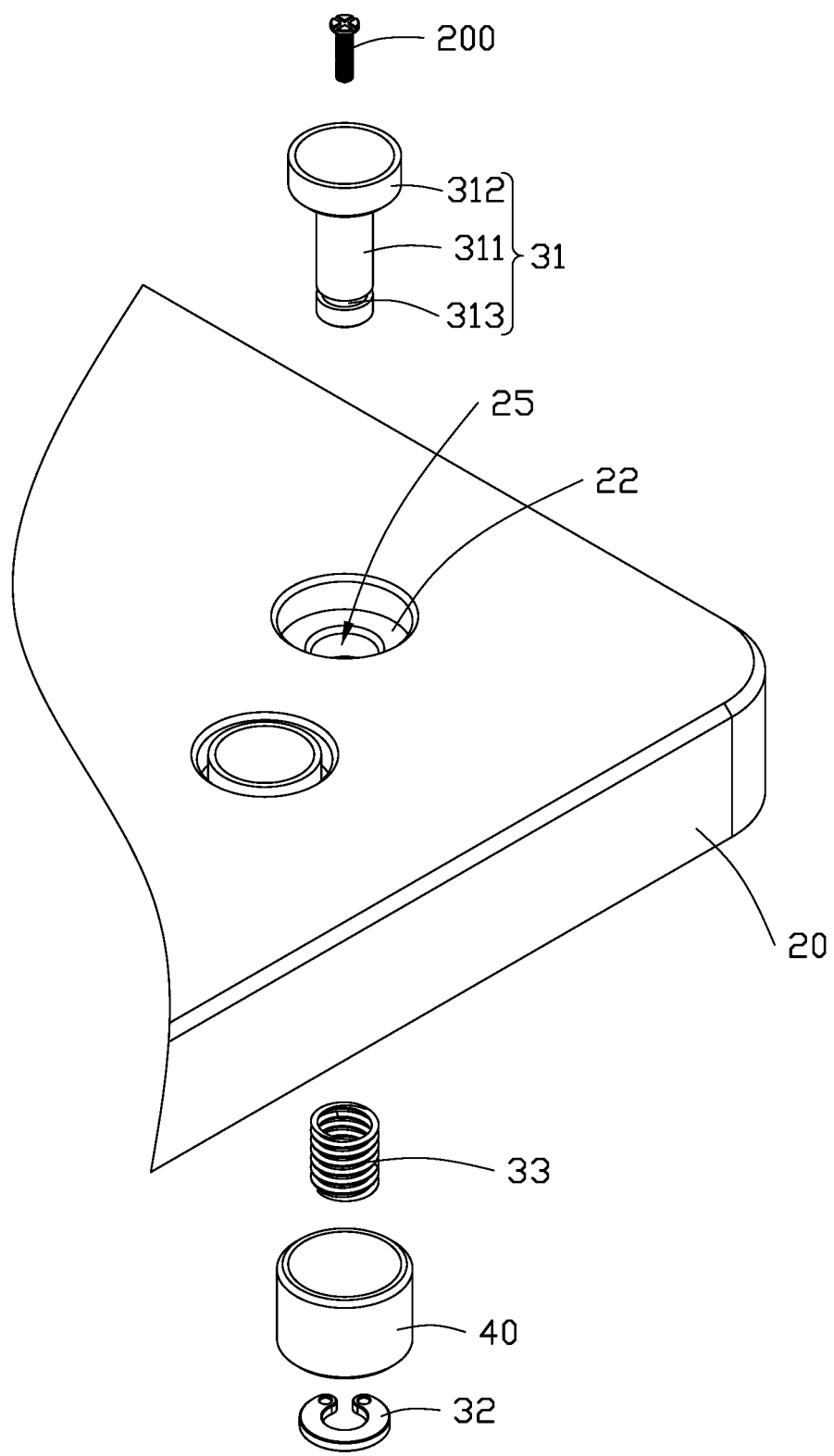
FIG. 3 is an exploded view of an embodiment of a guiding assembly of the device of FIG. 1.
Figure 4:
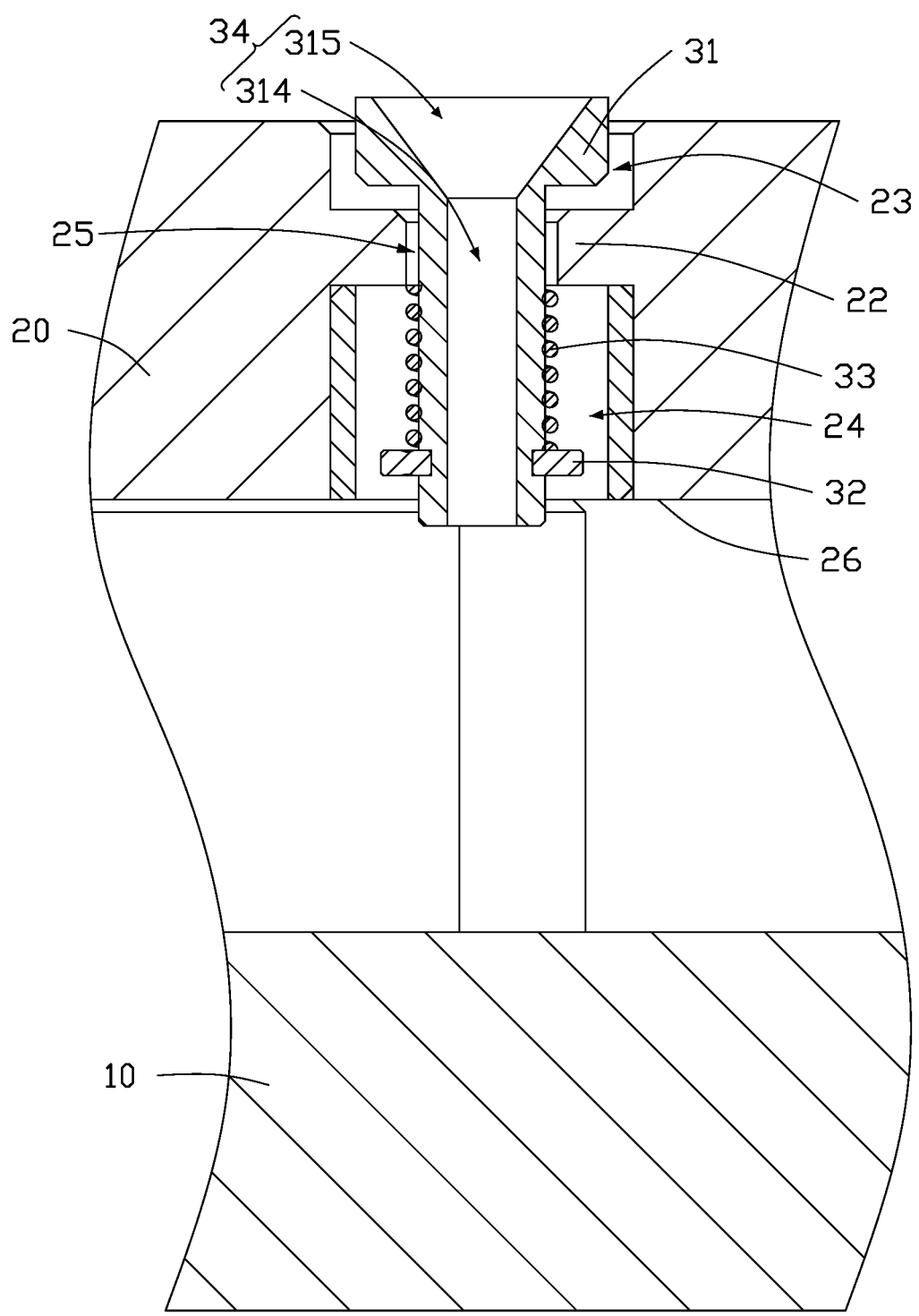
FIG. 4 is a sectional view of an embodiment of a guiding assembly in the device of FIG. 1.

FIGS. 3 and 4 illustrate the assembly board 20, and the assembly board 20 defines a plurality of openings 21. The number of the openings 21 corresponds to the number of the guiding modules 30. Each guiding module 30 is disposed in one opening 21.

In at least one embodiment, the assembly board 20 is formed with an annular step 22 in each opening 21, each annular step 22 and the assembly board 20 form a first receiving space 23 and a second receiving space 24.

The annular step 22 defines a through hole 25, and the through hole 25 is coupled to the first receiving space 23 and the second receiving space 24.

FIG. 5 illustrates the guiding module 30 including a guiding sleeve 31, a limiting member 32, and an elastic member 33.

In at least one embodiment, the guiding sleeve 31 defines a vertical channel 34, an end of the guiding sleeve 31 is configured to press against the circuit board 300 on the fixture board 10, and the vertical channel 34 faces the locking hole 310 on the circuit board 300. Therefore, the screw 200 can be accurately introduced into the locking hole 310 of the circuit board 300 through the vertical channel 34.

The guiding sleeve 31 is movably disposed in the opening 21. In the embodiment, the guiding sleeve 31 includes a resisting portion 311 and an importing portion 312, and the resisting portion 311 is opposite to the importing portion 312. A size of the resisting portion 311 corresponds to a size of the through hole 25, and the size of the resisting portion 311 is smaller than a size of the importing portion 312.

In an initial position, that is, the assembly board 20 not being pressed against the circuit board 300, the resisting portion 311 passes through the through hole 25 from the first receiving space 23 until being received in the second receiving space 24. The resisting portion 311 is thus exposed to a first surface 26 of the assembly board 20. The resisting portion 311 defines a through hole 314, and a size of the through hole 314 corresponds to a size of the screw 200. An end of the resisting portion 311 away from the importing portion 312 defines an annular slot 313. The importing portion 312 is received in the first receiving space 23. The importing portion 312 defines a step hole 315.

In the embodiment, the step hole 315 has a cross section in shape of an inverted ladder.

The importing portion 312 is coupled to the resisting portion 311 at the narrow end of the step hole 315, the step hole 315 is coupled to the through hole 314 to form the vertical channel 34.

The limiting member 32 is disposed at an end of the resisting portion 311 away from the importing portion 312. The elastic member 33 is disposed between the annular step 22 and the limiting member 32. In the embodiment, a size of the limiting member 32 is smaller than a size of the second receiving space 24.

In at least one embodiment, the limiting member 32 may be a circlip, and the circlip can engage with the annular slot 313.

In at least one embodiment, the elastic member 33 may be a spring, and the spring is sleeved on the resisting portion 311 and located between the annular step 22 and the limiting member 32.

In use, the assembly board 20 is disposed above the fixture board 10. The resisting portion 311 of the guiding sleeve 31 abuts against the circuit board 300, and the through hole 314 of the resisting portion 311 is aligned with the locking hole 310 on the circuit board 300. The resisting portion 311 is exposed on the first surface 26 of the assembly board 20. The assembly board 20 is dropped toward the fixture board 10 under the action of gravity to drive the annular step 22 to move toward the limiting member 32. Then, the annular step 22 will compress the elastic member 33, and the elastic member 33 is elastically deformed, the second receiving space 24 will receive the limiting member 32. Therefore, the elastic member 33 applies elastic force to the limiting member 32 in a direction close to the circuit board 300, and the resisting portion 311 of the guiding sleeve 31 is in close contact with the locking hole 310 on the circuit board 300. The vertical channel 34 is opposite to the locking hole 310 on the circuit board 300.

Therefore, the screw 200 can enter the through hole 314 of the resisting portion 311 through the step hole 315 of the importing portion 312, and be inserted into the locking hole 310 of the circuit board 300 through the through hole 314 in a precise manner.

In at least one embodiment, the assembly device 100 further includes a durable member 40. The durable member 40 is received in the second receiving space 24, and is fixed to the assembly board 20.

The durable member 40 is configured to prevent wear of the assembly board 20 when the limiting member 32 moves relative to the assembly board 20 in the second receiving space 24.

In at least one embodiment, the assembly device 100 further includes a rotating shaft 50. The assembly board 20 is rotatably coupled to the fixture board 10 through the rotating shaft 50.

The rotating shaft 50 is disposed between the fixture board 10 and the assembly board 20. When the assembly board 20 is pressed against the fixture board 10, the rotating shaft 50 ensures precise repeatability of the assembly board 20 relative to the fixture board 10.

The fixture board 10 positions the circuit board 300 through the positioning member 11, to ensure that the position of the circuit board 300 relative to the fixture board 10 is unchanged. Therefore, the assembly board 20 can be pressed into the fixture board 10, and the resisting portion 311 of the guiding sleeve 31 accurately resists the locking hole 310 on the circuit board 300.

The assembly device 100 presses the assembly board 20 against the fixture board 10, such that the guiding sleeve 31 abuts against the circuit board 300 on the fixture board 10. The assembly board 20 drives the annular step 22 to compress the elastic member 33, and the resisting portion 311 of the guiding sleeve 31 is closely attached to the locking hole 310 of the circuit board 300 under the elastic force of the elastic member 33.

Therefore, the screw 200 can be inserted precisely into the locking hole 310 through the guiding sleeve 31.

Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the exemplary embodiments described above may be modified within the scope of the claims.

What is claimed is:

1. An assembly device configured for installing a screw on a locking hole of a circuit board, comprising:
   an assembly board configured for pressing the circuit board; and
   a guiding sleeve defining a vertical channel; wherein the guiding sleeve is movably disposed in the assembly board;
   wherein when the assembly board presses the circuit board, an end of the guiding sleeve resists the circuit board, and the vertical channel faces the locking hole of the circuit board;
   wherein the guiding sleeve comprises a resisting portion and an importing portion, the resisting portion is opposite to the importing portion; the importing portion defines a step hole, and the importing portion is coupled to the resisting portion at a narrow end of the step hole; and
   wherein the assembly board defines an opening, the assembly board is formed with an annular step in the opening, the annular step and the assembly board forms a first receiving space and a second receiving space, and wherein the resisting portion is movably disposed in the opening, the annular step defines a second through hole, and the second through hole is coupled to the first receiving space and the second receiving space.

2. The assembly device of claim 1, wherein the resisting portion is opposite to the importing portion; and wherein the resisting portion defines a first through hole, and the step hole is coupled to the first through hole to form the vertical channel.

3. The assembly device of claim 2, wherein the resisting portion passes through the second through hole from the first receiving space until being received in the second receiving space, and the resisting portion is exposed to a surface of the assembly board.

4. The assembly device of claim 3, wherein the importing portion is received in the first receiving space.

5. The assembly device of claim 3, wherein the assembly device further comprises a limiting member, and the limiting member is disposed at an end of the resisting portion away from the importing portion.

6. The assembly device of claim 5, wherein the limiting member is a circlip, an end of the resisting portion away from the importing portion defines an annular slot, and the circlip is docked with the annular slot.

7. The assembly device of claim 5, wherein the assembly device further comprises an elastic member, and the elastic member is disposed between the annular step and the limiting member.

8. The assembly device of claim 7, wherein the elastic member is a spring, and the spring is sleeved on the resisting portion and located between the annular step and the limiting member.

9. The assembly device of claim 5, wherein the assembly device further comprises a durable member, the durable member is received in the second receiving space, and is fixedly coupled to the assembly board; wherein the durable member protects the assembly board from rubbing against the limiting member when the limiting member moves relative to the assembly board in the second receiving space.

10. The assembly device of claim 1, wherein the assembly device further comprises a fixture board, and the fixture board is rotatably coupled to the assembly board; and wherein the fixture board comprises a plurality of positioning members and a main body, the positioning members are fixedly disposed on the main body, and the positioning members are configured to position the circuit board on the main body.

11. The assembly device of claim 10, wherein the assembly device further comprises a rotating shaft, the assembly board is rotatably coupled to the fixture board through the rotating shaft.

12. An assembly device configured for installing a screw on a locking hole of a circuit board, comprising:
  an assembly board configured for pressing the circuit board; and
  a guiding sleeve defining a vertical channel; wherein the guiding sleeve is movably disposed in the assembly board;
  wherein when the assembly board presses the circuit board, an end of the guiding sleeve resists the circuit board, and the vertical channel faces the locking hole of the circuit board; and
  wherein the guiding sleeve comprises a resisting portion and an importing portion, and the resisting portion is opposite to the importing portion; and wherein the resisting portion defines a first through hole, the importing portion defines a step hole, the importing portion is coupled to the resisting portion at a narrow end of the step hole, and the step hole is coupled to the first through hole to form the vertical channel; and
  wherein the assembly device further comprises a fixture board, and the fixture board is rotatably coupled to the assembly board; and wherein the fixture board comprises a plurality of positioning members and a main body, the positioning members are fixedly disposed on the main body, and the positioning members are configured to position the circuit board on the main body.

13. The assembly device of claim 12, wherein the assembly board defines an opening, the assembly board is formed with an annular step in the opening, the annular step and the assembly board forms a first receiving space and a second receiving space; wherein the annular step defines a second through hole, the second through hole is coupled to the first receiving space and the second receiving space; and wherein the resisting portion is movably disposed in the opening, the resisting portion passes through the second through hole from the first receiving space until being received in the second receiving space, and the resisting portion is exposed to a surface of the assembly board.

14. The assembly device of claim 13, wherein the importing portion is received in the first receiving space.

15. The assembly device of claim 13, wherein the assembly device further comprises a limiting member, and the limiting member is disposed at an end of the resisting portion away from the importing portion.

16. The assembly device of claim 15, wherein the limiting member is a circlip, an end of the resisting portion away from the importing portion defines an annular slot, and the circlip is docked with the annular slot.

17. The assembly device of claim 15, wherein the assembly device further comprises an elastic member, and the elastic member is disposed between the annular step and the limiting member.

18. The assembly device of claim 17, wherein the elastic member is a spring, and the spring is sleeved on the resisting portion and located between the annular step and the limiting member.

19. The assembly device of claim 15, wherein the assembly device further comprises a durable member, the durable member is received in the second receiving space, and is fixedly coupled to the assembly board; wherein the durable member protects the assembly board from rubbing against the limiting member when the limiting member moves relative to the assembly board in the second receiving space.

* * * * *